US009712211B2

(12) United States Patent
Courouve et al.

(10) Patent No.: US 9,712,211 B2
(45) Date of Patent: Jul. 18, 2017

(54) QUADRATURE DEMODULATOR FOR A VERY HIGH BIT RATE RFID RECEIVER

(71) Applicant: Commissariat A L'Energie Atomique et aux Energies Alternatives, Paris (FR)

(72) Inventors: Pierre Courouve, Domene (FR); Jean-Baptiste Dore, Sain Martin le Vinoux (FR); Manuel Pezzin, Grenoble (FR)

(73) Assignee: COMMISSARIAT A L'ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/204,310

(22) Filed: Jul. 7, 2016

(65) Prior Publication Data

US 2017/0012676 A1  Jan. 12, 2017

(30) Foreign Application Priority Data

Jul. 9, 2015  (FR) ...................................... 15 56537

(51) Int. Cl.

| | |
|---|---|
| *H04L 27/22* | (2006.01) |
| *H04B 5/00* | (2006.01) |
| *H03D 3/04* | (2006.01) |
| *H04L 27/233* | (2006.01) |
| *H04L 27/38* | (2006.01) |
| *H04L 27/227* | (2006.01) |

(52) U.S. Cl.

CPC ............. *H04B 5/0062* (2013.01); *H03D 3/04* (2013.01); *H04L 27/2272* (2013.01); *H04L 27/2278* (2013.01); *H04L 27/233* (2013.01); *H04L 27/3845* (2013.01)

(58) Field of Classification Search
CPC .......................... H04B 1/7117; H04L 25/0202
See application file for complete search history.

(56) References Cited

U.S. PATENT DOCUMENTS

2011/0018626 A1   1/2011  Kojima
2014/0347122 A1  11/2014  Hong et al.
(Continued)

OTHER PUBLICATIONS

French Preliminary Search Report issued Mar. 3, 2016 in French Application 15 56537, filed on Jul. 9, 2015 ( with English Translation of Categories of Cited Documents).

(Continued)

*Primary Examiner* — Jaison Joseph
(74) *Attorney, Agent, or Firm* — Oblon, McClelland, Maier & Neustadt, L.L.P.

(57) ABSTRACT

A quadrature demodulator not requiring analog mixers. The demodulation is made using a first integrator and a second integrator which are controlled by square logic signals at twice the frequency of the carrier, the received signal being alternatively integrated by the first integrator and the second integrator over periods of time equal to a quarter period of time of the carrier frequency. The samples of the first and second integrators are sampled and subtracted from each other. The successive samples are combined in a first and a second combining module for providing in-phase and quadrature component samples. This demodulator can further be provided with a synchronization module IQ and a symbol synchronization module.

12 Claims, 6 Drawing Sheets

(56) References Cited

U.S. PATENT DOCUMENTS

| | | | | |
|---|---|---|---|---|
| 2015/0009906 A1* | 1/2015 | Dore | ................. | H04W 74/0816 |
| | | | | 370/329 |
| 2015/0124749 A1* | 5/2015 | Mawlawi | .......... | H04W 74/0816 |
| | | | | 370/329 |
| 2015/0372715 A1* | 12/2015 | Dehmas | ............... | H04B 1/7075 |
| | | | | 375/140 |
| 2016/0013961 A1* | 1/2016 | Dore | .................... | H04L 27/264 |
| | | | | 375/316 |
| 2016/0301554 A1* | 10/2016 | Dore | ........................ | H04B 1/16 |

OTHER PUBLICATIONS

Iker Mayordomo et al. "Design and Analysis of a Complete RFID System in the UHF Band Focused on the Backscattering Communication and Reader Architecture", RFID Systems and Technologies, 2007, 6 pages.

R.C.H. Van De Beek et al "A 13.56 Mbps PSK Receiver for 13.56 MHz RFID Applications", 2012 IEEE Radio Frequency Integrated Circuits Symposium, 2012, 4 pages.

M. Gossar et al. "Parameter Analysis and Reader Architectures for Broadband 13.56 MHz RFID Systems", IMS 2010, 2010 IEEE, 4 pages.

U.S. Appl. No. 15/094,200, filed Apr. 8, 2016, Jean-Baptoste Dore.

* cited by examiner

QUADRATURE DEMODULATOR FOR A VERY HIGH BIT RATE RFID RECEIVER

TECHNICAL FIELD

The present invention generally relates to the field of RFID (Radio Frequency Identification) receivers and more particularly Very High Bit Rate (VHBR) RFID receivers.

STATE OF PRIOR ART

The first generation of RFID systems has been standardized in ISO/IEC 14442-Part 2 standard. The standard in question allows for a transmission using a carrier frequency f of 13.56 MHz with two modulation types: a first so-called type A modulation corresponding to an amplitude modulation or ASK (Amplitude Shift Keying) having a 100% modulation depth and a Manchester coding and a second so-called type B modulation corresponding to a modulation with non-return to zero (NRZ) having a 10% modulation depth. Both modulation types are allowed for bit rates ranging up to 846 kbit/s.

However, new applications of the RFID systems in particular in the field of identification (electronic passport for example) require higher bit rates. To achieve higher bit rates while respecting the spectral mask set by the standard, it has been provided to resort to a phase modulation or PSK (Phase Shift Keying) and to reduce the symbol duration. The phase modulation orders currently contemplated range from 2 to 16 (2-PSK, 4-PSK, 8-PSK, 16-PSK). The symbol duration currently provided is 2T or 4T where T=1/f is the period of the abovementioned carrier. In other words, the modulation rate is 6.78 Mbaud or 3.39 Mbaud. It is understood that with a modulation rate of 6.78 Mbaud and a modulation 16-PSK, bit rates of 27.12 Mbit/s can now be reached. Another mode provides for the use of an ASK (Amplitude-Shift Keying) modulation with a modulation rate ranging up to 6.78 Mbaud that enables a flow rate of 6.78 Mbit/s to be reached.

However, if the receivers of the first generation RFID systems, that is having a low bit rate, had a particularly simple architecture, the ones with a very high bit rate have to resort to a relatively complex signal processing to counteract inter-symbol interference. This inter-symbol interference is due to the bandpass nature of the coupling between the reader and the RFID system card, it cannot be neglected at a high bit rate any longer.

Equalization techniques which are the more simple to implement operate on a sampled version of the complex signal (by comparison with the non-linear ones operating on the sampled phase information) and consequently resort to a quadrature demodulation (also called I/Q demodulation) requiring generally analogue mixers. But, these mixers are hardly compatible with the architecture of RFID receivers given that the latter are powered only by the energy of the carrier.

The paper by R. C. H. van de Beek and al. entitled "A 13.56 Mbps PSK receiver for 13.56 MHz RFID applications" published in Proc. of IEEE Radio Frequency Integrated Circuits Symposium (RFIC), pp. 239-242, 17-19 Jun. 2012, describes a RFID receiver comprising a phase demodulation in the analogue field based on the time measurement separating zero crossings of the RF signal received from the zero crossings of the signal of the carrier recovered. This architecture is complex and the demodulation result is relatively sensitive to noise.

The paper by M. Gossar and al. entitled "Parameter analysis and reader architectures for broadband 13.56 MHz RFID systems" published in Microwave Symposium Digest (MTT), IEEE MTT-S Intl, pp. 1524-1527, 23-28 May 2010, describes a RFID receiver having a SDR (Software Defined Radio) architecture and using an analogue/digital (ADC) converter in RF band to make a direct quadrature demodulation in the digital field. However, the drawback of such a receiver is to be relatively sensitive to noise and to require high dynamic converters.

The purpose of the present invention is consequently to provide an I/Q demodulator, particularly suitable for the requirements of a RFID receiver, which is simple and robust while having a reduced sensitivity to noise than in prior art.

DISCLOSURE OF THE INVENTION

The present invention is defined by a quadrature demodulator for demodulating a received signal modulated at a carrier frequency f=1/T, the demodulator generates a square logic signal ($g^+(t)$) at the frequency 2f and a second square logic signal ($\bar{g}^+(t)$) being the inverse of the first one, the demodulator comprising:

a first integrator for integrating a first component of the received signal ($y(t)$, $y^+(t)$) when the first logic signal is in a high state and providing a first integration result when the first logic signal is in a low state;

a second integrator for integrating said component of the received signal ($y(t)$, $y^+(t)$) when the second logic signal is in a high state and providing a second integration result when the second logic signal is in a low state;

a first subtractor for subtracting the second integration result from the first integration result for providing samples $z_n$ at the frequency 4f;

a first combining module for combining successive samples $z_n$, $z_{n-1}$, $z_{n-2}$, $z_{n-3}$ and providing samples $I_n = z_n - z_{n-1} - z_{n-2} + z_{n-3}$ at the frequency 4f;

a second combining module for combining successive samples $z_n$, $z_{n-1}$, $z_{n-2}$, $z_{n-3}$ and providing samples $Q_n = z_n - z_{n-1} + z_{n-2} + z_{n-3}$ at the frequency 4f;

a first decimator for decimating the samples $I_n$ with a decimation factor 4 for providing in-phase component samples $I(kT)$;

a second decimator for decimating the samples $Q_n$ with a decimation factor 4 for providing quadrature component samples $Q(kT)$.

According to a first embodiment, said first component of the received signal is the received signal itself.

According to a second embodiment of the invention, the first component ($y^+(t)$) corresponds to the positive part of the received signal, a second component ($y^-(t)$) corresponds to the negative part of the received signal, the received signal being a combination of the first component and the second component, and the demodulator further comprises:

a third integrator for integrating the second component of the received signal when the first logic signal is in a high state and providing a third integration result when the first logic signal is in a low state;

a fourth integrator for integrating the second component of the received signal when the second logic signal is in the high state and providing a fourth integration result when the second logic signal is in the low state;

a second subtractor for subtracting the fourth integration result from the third integration result, the samples $z_n$ being obtained as a combination of the results from the first and second subtractors.

In the first embodiment, the quadrature demodulator can comprise a first analogue-digital converter for converting the first and second integration results before the subtraction by the first subtractor.

In the second embodiment, the quadrature demodulator can comprise a first analogue/digital converter for converting the first and second integration results before the subtraction by the first subtractor as well as a second analogue/digital converter for converting the third and fourth integration results before the subtraction by the second subtractor.

Advantageously, the quadrature demodulator comprises a first demultiplexer receiving the samples $I_n$ and demultiplexing them to four outputs, a second demultiplexer receiving the samples $Q_n$ and providing them to four outputs, the quadrature demodulator further comprising a first decision module receiving at least one sample on an output of the first demultiplexer and at least one sample on a corresponding output of the second demultiplexer, said decision module deciding, for a time interval when said carrier is not modulated, the decimation point in time in the first and second decimators.

According to a first alternative, the first decision module receives two consecutive samples $I_n$, $I_{n-1}$ on two neighbouring outputs of the first demultiplexer and two consecutive samples $Q_n$, $Q_{n-1}$ on two neighbouring outputs of the second demultiplexer, the first decision module deciding the decimation point in time by comparing in absolute value $I_n$, $I_{n-1}$ with a predetermined threshold and for the value and for the sample $I_n$, resp. $I_{n-1}$, lower than this threshold by determining the sign of the corresponding sample $Q_n$, resp. $Q_{n-1}$.

According to a second alternative, the decision module receives two consecutive samples $I_n$, $I_{n-1}$ on two neighbouring outputs of the first demultiplexer and two consecutive samples $Q_n$, $Q_{n-1}$ on two neighbouring outputs of the second demultiplexer, the first decision module deciding the decimation point in time by comparing in absolute value $Q_n$, $Q_{n-1}$ with a predetermined threshold and for the value and for the sample $Q_n$, resp. $Q_{n-1}$, lower than this threshold by determining the sign of the corresponding sample $I_n$, resp. $I_{n-1}$.

Advantageously, the samples on each of the two neighbouring outputs of the first and second demultiplexers are filtered by low-pass filters (551-554) before being provided to the first decision module.

When each transmission frame beginning with a sequence of a, a, a*, a*, a, a, . . . type pilot symbols, the samples output from the second decimator can be advantageously converted by a third demultiplexer, the samples of one of the outputs of the third demultiplexer being sign-detected before being correlated by a signed sequence having a predetermined length in a correlator, and a second decision module is activated as soon as the result of this correlation exceeds a predetermined threshold.

The samples of the different outputs from the third demultiplexer can be respectively correlated with said signed sequence in a plurality of correlators for providing a plurality of correlation results, the decision module determining, when activated, the highest correlation result and deducing therefrom the sampling point in time of at least one third and one fourth decimator respectively receiving the samples output from the first and second decimators for providing the in-phase and quadrature components of the modulation symbols at the baud frequency.

The invention further relates to a method for demodulating a received signal modulated at a carrier frequency $f=1/T$, wherein, from a signal locked at this frequency, a first square logic signal ($g^+(t)$) at the frequency $2f$ and a second square logic signal ($\overline{g}^+(t)$) being inverse from the first one are generated and there are performed:

a first integration of a first component of the received signal (y(t), $y^+(t)$) when the first logic signal is in a high state, a first integration result being obtained when the first logic signal is in a low state;

a second integration of said component of the received signal (y(t), $y^+(t)$) when the second logic signal is in a high state, a second integration result being obtained when the second logic signal is in a low state;

a subtraction for subtracting the second integration result from the first integration result and providing samples $z_n$ at the frequency $4f$;

a first combination for combining successive samples $z_n$, $z_{n-1}$, $z_{n-2}$, $z_{n-3}$ and providing samples $I_n = z_n - z_{n-1} - z_{n-2} + z_{n-3}$ at the frequency $4f$;

a second combination for combining successive samples $z_n$, $z_{n-1}$, $z_{n-2}$, $z_{n-3}$ and providing samples $Q_n = -z_n - z_{n-1} + z_{n-2} + z_{n-3}$ at the frequency $4f$;

a first decimation for decimating the samples $I_n$ with a decimation factor 4 for providing in-phase component samples $I(kT)$;

a second decimation for decimating the samples $Q_n$ with a decimation factor 4 for providing quadrature component samples $Q(kT)$.

BRIEF DESCRIPTION OF THE DRAWINGS

Further characteristics and advantages of the invention will appear upon reading a preferential embodiment of the invention in reference to the appended figures in which.

DETAILED DISCLOSURE OF PARTICULAR EMBODIMENTS

The idea underlying the present invention is to approximate the functions acting as a basis for the I/Q demodulator by window functions. Using window functions rather than conventional sinusoidal functions advantageously enables analogue mixers to be dispensed with.

First, the baseband demodulation principle by sinusoidal functions is reminded. If the signal to be demodulated is referred to as y(t), the conventional baseband demodulator performs a multiplication by quadrature sinusoidal functions at the frequency f of the carrier, and then a sampling of the I and Q channels at the same frequency. In other words, such a conventional demodulator provides baseband samples defined by:

$$I(kT) = \int_{kT}^{(k+1)T} y(t)\cos(2\pi ft)dt \qquad (1\text{-}1)$$

$$Q(kT) = \int_{kT}^{(k+1)T} y(t)\sin(2\pi ft)dt \qquad (1\text{-}2)$$

where $T=1/f$. The signal to be demodulated is expressed in the following form:

$$y(t)=A(t)\cos(2\pi ft+P(t)) \qquad (2)$$

where $A(t)$ is a signal modulating the amplitude and $P(t)$ is a signal modulating the phase. Since the modulation is very slow with respect to the period of the carrier, $A(t)$ and $P(t)$ can be considered as been constant on a duration T. The samples on the channels I and Q have consequently the following simplified form:

$$I(kT)=A(kT)\cos(P(kT)) \qquad (3\text{-}1)$$

$$Q(kT)=A(kT)\sin(P(kT)) \qquad (3\text{-}2)$$

Figure 1:
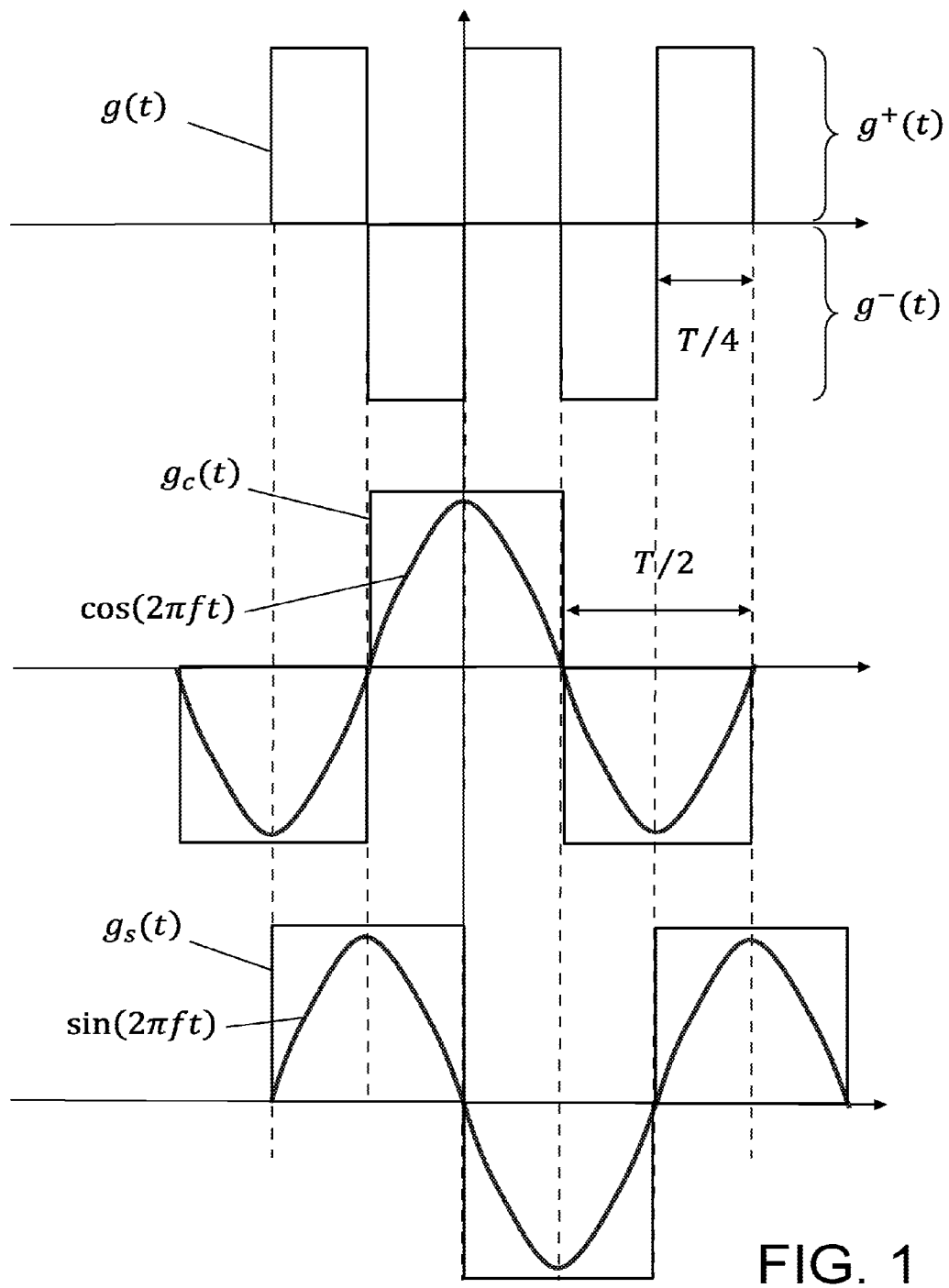
FIG. 1 schematically represents functions useful for a quadrature demodulation according to the principle of the invention.

According to the principle of the invention, a demodulation base formed by two quadrature window functions, $g_c(t)$ and $g_s(t)$, having a period T, respectively approximating the functions $\cos(2\pi ft)$ and $\sin(2\pi ft)$ is used. More precisely:

$$g_c(t) = \Pi\left(\frac{t}{T/2}\right) \otimes \sum_k (-1)^k \delta(t-kT/2) \qquad (4\text{-}1)$$

$$g_s(t) = g_c(t-T/4) \qquad (4\text{-}2)$$

where $$\Pi\left(\frac{t}{T/2}\right)$$

is the gate function with a width T/2, centred on 0, taking the value 1 in this interval and the zero value anywhere else and $$\sum_k (-1)^k \delta(t-kT/2)$$

is the alternate comb function with a period T, $\delta(.)$ being the Dirac distribution. Functions $g_c(t)$ and $g_s(t)$ as well as functions $\cos(2\pi ft)$ and $\sin(2\pi ft)$ are represented in FIG. 1.

The decomposition according to this base gives:

$$I(kT) = \int_{kT}^{(k+1)T} y(t)g_c(t)dt \qquad (5\text{-}1)$$

$$Q(kT) = \int_{kT}^{(k+1)T} y(t)g_s(t)dt \qquad (5\text{-}2)$$

Functions $g_c(t)$ and $g_s(t)$ can be decomposed into Fourier series, for example:

$$g_s(t) = \sum_{p=1}^{\infty} \frac{1}{2p-1}\sin(2\pi f(2p-1)t) \qquad (6)$$

As a result, there is:

$$Q(kT) = \int_{kT}^{(k+1)T} y(t) \sum_{p=1}^{\infty} \frac{1}{2p-1}\sin(2\pi f(2p-1)t)dt \qquad (7)$$

that is, with the same hypothesis with a low modulation variation $A(t)$ and $P(t)$ on a symbol time:

$$Q(kT) = \frac{1}{2}A(kT)\sin(P(kT)) + \sum_{p=2}^{\infty} \frac{1}{2p-1} \int_{kT}^{(k+1)T} \frac{1}{2} \qquad (8)$$

$$(A(t)\sin(4p\pi ft + P(t)) + \sin(4(p-1)\pi ft - P(t))dt$$

The first term of expression (8) corresponds to the fundamental frequency $f=1/T$ of the square signal and the following terms to the harmonics with the frequencies pf. Assuming again a low modulation rate as previously, all these terms represent integrals of sinusoidal functions with the frequencies pf on a period T and are thus zero.

A similar calculation can be performed for $g_c(t)$. Finally, as a result, there is:

$$I(kT)=\tfrac{1}{2}A(kT)\cos(P(kT)) \qquad (9\text{-}1)$$

$$Q(kT)=\tfrac{1}{2}A(kT)\sin(P(kT)) \qquad (9\text{-}2)$$

Both functions $g_c(t)$ and $g_s(t)$ can be generated from a window function $g(t)$ with a period T/2 defined by:

$$g(t) = \Pi\left(\frac{t-T/8}{T/4}\right) \otimes \sum_k (-1)^k \delta(t-kT/4) \qquad (10)$$

where $$\Pi\left(\frac{t}{T/4}\right)$$

is the gate function taking the value 1 on the support $$\left[0, \frac{T}{4}\right]$$

and zero anywhere else and $$\sum_k (-1)^k \delta(t-kT/4)$$

is the alternate comb function with a period T/2. Function $g(t)$ is also represented in FIG. 1.

Function $g_c(t)$ can be obtained in the following way:

$g_c(t)=+g(t)$ for $t \in [kT, kT+T/4[$ $g_c(t)=-g(t)$ for $t \in [kT+T/4, kT+T/2[$ $g_c(t)=-g(t)$ for $t \in [kT+T/2, kT+3T/4[$ $g_c(t)=+g(t)$ for $t \in [kT+3T/4, (k+1)T[$ (11)

Likewise, t function $g_s(t)$ can be obtained in a similar way by:

$g_s(t)=-g(t)$ for $t \in [kT, kT+T/4[$ $g_s(t)=-g(t)$ for $t \in [kT+T/4, kT+T/2[$ $g_s(t)=+g(t)$ for $t \in [kT+T/2, kT+3T/4[$ $g_s=+g(t)$ for $t \in [kT+3T/4, (k+1)T[$ (12)

If the logic signal corresponding to the positive part of $g(t)$ is referred to as $$g^+(t) = \Pi\left(\frac{t-T/8}{T/4}\right) \otimes \sum_k \delta(t-kT/2)$$

and the logic signal corresponding to the negative part of $g(t)$ is referred to as $$g^-(t) = \Pi\left(\frac{t+T/8}{T/4}\right) \otimes \sum_k \delta(t-kT/2),$$

there is:

$g(t)=g^+(t)-g^-(t)=g^+(t)-\overline{g}^+(t)$ (13)

where $\overline{g}^+(t)$ designates the logic inverse of $g^+(t)$.

The product $w(t)=y(t)g(t)=y(t)g^+(t)-y(t)\overline{g}^+(t)$ can thus be obtained from simple switching (by logic signals) and subtraction operations. The samples on the channels I and Q are then deduced by:

$$I(kT) = \int_{kT}^{kT+T/4} w(t)dt - \int_{kT+T/4}^{kT+T/2} w(t)dt - \int_{kT+T/2}^{kT+3T/4} w(t)dt + \int_{kT+3T/4}^{(k+1)T} w(t)dt \quad (14\text{-}1)$$

$$Q(kT) = -\int_{kT}^{kT+T/4} w(t)dt - \int_{kT+T/4}^{kT+T/2} w(t)dt + \int_{kT+T/2}^{kT+3T/4} w(t)dt + \int_{kT+3T/4}^{(k+1)T} w(t)dt \quad (14\text{-}2)$$

Equations (14-1) and (14-2) show that the in-phase and quadrature samples can be simply obtained from the integration results of the product $w(t)$ on four consecutive period quarters.

More generally, the in-phase and quadrature samples can be obtained from integration results of a signal $w_a(t)=g_a(t)y(t)$ where $g_a(t)$ is a window function with a period $$T_a = \frac{T}{2a}$$

where a is a non-zero integer, the integration being performed on 4a successive time windows with a width $$\frac{T}{4a}.$$

However, it can be shown that we can always return to the case a=1 by gathering these integration results as groups of a successive terms, only the granularity of the time division into windows with the width T/4 being important. Thus, it will be supposed in the following, without making a generalisation, that a=1.

Figure 2:
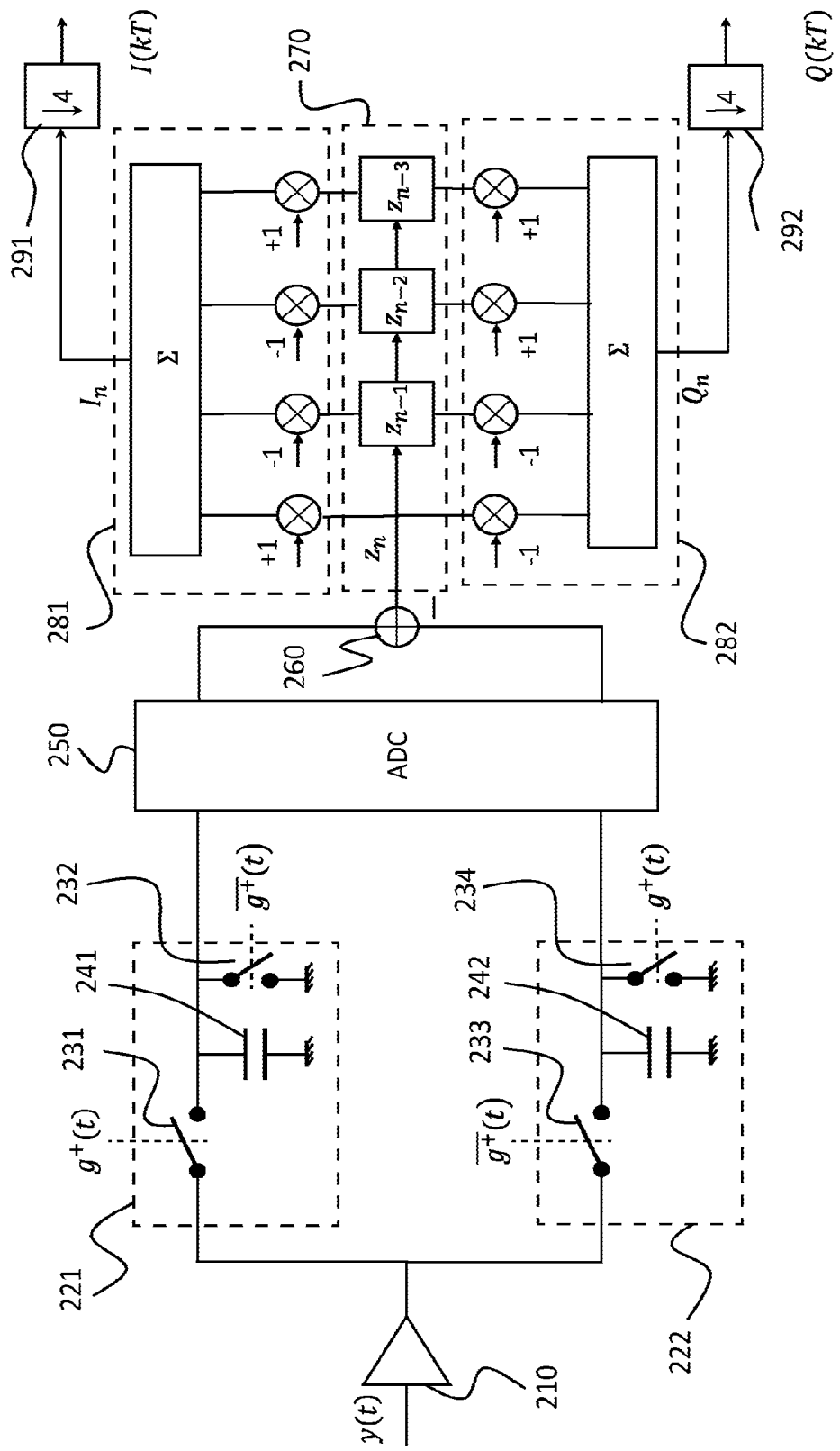
FIG. 2 schematically represents a quadrature demodulator, suitable for a RFID VHBR receiver, according to a first embodiment of the invention.

FIG. 2 represents a quadrature demodulator according to a first embodiment of the invention.

The RF received signal y(t) is amplified by an amplifier 210 and then integrated by a first integrator 221 and a second integrator 222 arranged in parallel. For example, the signal y(t) could be a voltage signal and the amplifier 210 a transconductance amplifier to convert this voltage signal into a current signal, integrated in parallel by the integrators 221 and 222.

The first integrator comprises a first switch 231 controlled by the logic signal $g^+(t)$ and a second switch 232 controlled by the inverse logic signal $\overline{g}^+(t)$. When the first switch 231 is closed, the second switch 232 is open and the signal y(t) is integrated in the capacitor 241. Reversely, when the first switch is open, the integration result is read and then the second switch is closed to discharge the capacitor 241 (it will be understood that strictly speaking, the control signal of the second switch will have a high level for a fraction of $\overline{g}^+(t)$ so as to allow a reading before resetting).

In a similar way, the second integrator comprises a third switch 233 controlled by the logic signal $\overline{g}^+(t)$ and a fourth switch 234 controlled by the logic signal $g^+(t)$. When the third switch 233 is closed, the fourth switch 234 is open and the signal y(t) is integrated in the capacitor 242. When the third switch 233 is open, the integrated signal is read and then the fourth switch is closed to discharge the capacitor 242.

It is understood that the integrators 221 and 222 operate alternately: when the first one integrates the received signal, the integration result of the second one is read and then reset and, reversely, when the second one integrates the received signal, the integration result of the first one is read and then reset.

By reading the first one or the integration result, it is meant herein the conversion of these results by an analogue-digital converter 250 operating at the frequency 4f (or alternatively, by two analogue digital converters operating on each of the channels).

The integration result of the second integrator is subtracted from the integration result of the first integrator in a first summer 260 (an input of the summer being inversed). Thus, at a sampling point in time $$t_n = n\frac{T}{4},$$

the value output from the subtractor is equal to:

$$z_n = \int_{(n-1)\frac{T}{4}}^{n\frac{T}{4}} w(t)dt \tag{15}$$

The successive values $z_n$ are stored in a buffer memory, 270. More precisely, at the point in time t the buffer contains the previous values $z_{n-1}, z_{n-2}, z_{n-3}$. A first combining module 281 performs the combination:

$$I_n = z_n - z_{n-1} - z_{n-2} + z_{n-3} \tag{16-1}$$

and a second combining module 282 performs the combination:

$$Q_n = -z_n - z_{n-1} + z_{n-2} + z_{n-3} \tag{16-2}$$

The outputs of the first and second combining modules are decimated by a factor 4 respectively in the decimators 291 and 292 to give:

$$I(kT) = I_{4n} \tag{17-1}$$

$$Q(kT) = Q_{4n} \tag{17-2}$$

It is understood that the architecture of the quadrature demodulator provided thus enables the samples of the channels I and Q to be obtained in a very simple and robust way, without resorting to analogue mixers. Furthermore, the received signal is steadily integrated, alternately by the first integrator and the second integrator, such that the sampling result is poorly sensitive to noise.

Figure 3:
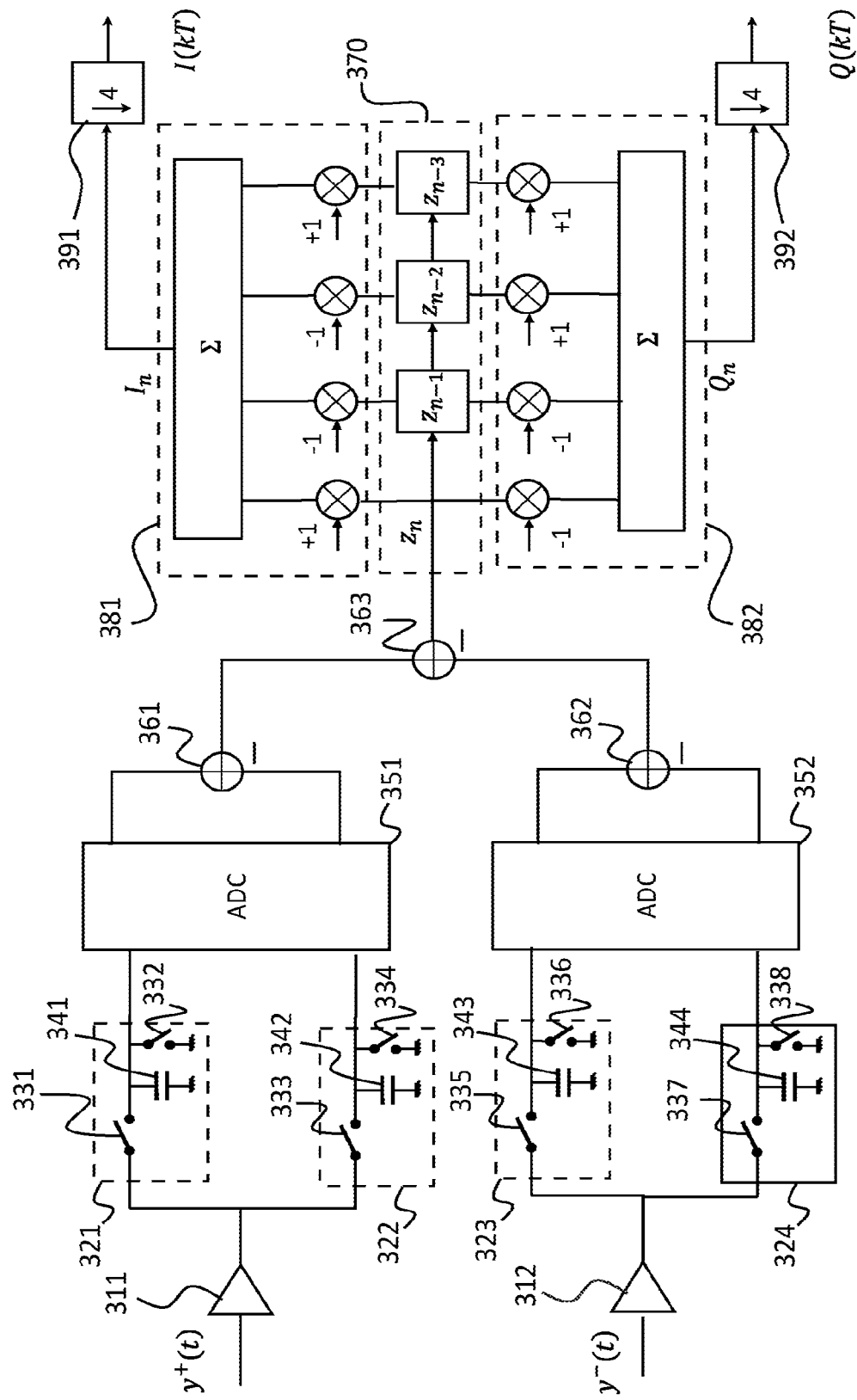
FIG. 3 schematically represents a quadrature demodulator, suitable for a RFID VHBR receiver, according to a second embodiment of the invention.

FIG. 3 schematically represents a quadrature demodulator according to a second embodiment of the invention.

Unlike the first embodiment, it is assumed that the input signal is obtained in a rectified form. More precisely, this has the form of a positive component, noted $y^+(t)$, and a negative component, noted $y^-(t)$, such that:

$$y(t) = y^+(t) - y^-(t) \tag{18}$$

The product w(t) can then be written as:

$$w(t) = y^+(t)g^+(t) - y^+(t)\bar{g}^+(t) - y^-(t)g^+(t) + y^-(t)\bar{g}^+(t) \tag{19}$$

The positive component of the received signal, $y^+(t)$, is amplified by an amplifier 311 and integrated in a first integrator 321 as well as in a second integrator 322, which are arranged in parallel. As previously, the amplifier 311 can be a transconductance amplifier.

The first integrator 321 comprises a first switch 331 controlled by the logic signal $g^+(t)$ and a second switch 332 controlled by the inverse logic signal $\bar{g}^+(t)$. When the first switch 331 is closed, the second switch 332 is open and the positive component $y^+(t)$ is integrated in the capacitor 341. Reversely, when the first switch 331 is open, the integration result is read and then the second switch 332 is closed to discharge the capacitor 341.

The second integrator 322 comprises a third switch 333 controlled by the logic signal $\bar{g}^+(t)$ and a fourth switch 334 controlled by the inverse logic signal $g^+(t)$. When the third switch 333 is closed, the fourth switch 334 is open and the positive component $y^+(t)$ is integrated in the capacitor 342. Reversely, when the third switch 333 is open, the integration result is read and then the fourth switch 334 is closed to discharge the capacitor 342.

Accordingly, it is understood that the first and second integrators provide the integration results of $y^+(t)g^+(t)$ and $y^+(t)\bar{g}^+(t)$ respectively on a duration $$\frac{T}{4}.$$

After a conversion by the converter 351, the integration result output from the second integrator is subtracted from the integration result output from the first integrator by means of a first summer 361.

In the same way, the negative component, $y^-(t)$, is amplified by an amplifier 312 and integrated in a third integrator 323 as well as in a fourth integrator 324, arranged in parallel. The amplifier 312 can be a transconductance amplifier.

The third integrator 323 comprises a fifth switch 335 controlled by the logic signal $g^+(t)$ and a sixth switch 336 controlled by the inverse logic signal $\bar{g}^+(t)$. When the fifth switch 335 is closed, the sixth switch 336 is open and the negative component $y^-(t)$ is integrated in the capacitor 343. Reversely, when the fifth switch 335 is open, the integration result is read and then the sixth switch 336 is closed to discharge the capacitor 343.

The fourth integrator 324 comprises a seventh switch 337 controlled by the logic signal $\bar{g}^+(t)$ and an eighth switch 338 controlled by the inverse logic signal $g^+(t)$. When the seventh switch 337 is closed, the eighth switch 338 is open and the negative component $y^-(t)$ is integrated in the capacitor 344. Reversely, when the seventh switch 337 is open, the integration result is read and then the eighth switch 338 is closed to discharge the capacitor 344.

Accordingly, it is understood that the third and fourth integrators provide the integration results of $y^-(t)g^+(t)$ and $y^-(t)\bar{g}^+(t)$ respectively on a duration $$\frac{T}{4}.$$

After a conversion by the analogue digital converter 352, the integration result output from the fourth integrator is subtracted from the integration result output from the third integrator by means of a second summer 362.

The result output from the second summer 362 is then subtracted from the result output from the first summer 361 by means of a third summer 363. It will be understood that the first, second and third summers could be replaced by a single summer performing the combination of the integration results based on expression (19). Likewise, in 351 and 352 are represented two ADC converters for each of the positive and negative components. However, it will be understood that an architecture with four ADC converters with half the frequency or a single with twice the frequency could be contemplated. Generally, the degree of mutualisation of the different components of the demodulator will result from a compromise between their number and their working frequency, in a known manner per se.

Anyway, the summation results, noted $z_n$ as previously, are stored in a buffer memory 370. At the point in time $t_n$, the buffer contains the previous values $z_{n-1}, z_{n-2}, z_{n-3}$. As in the first embodiment, a first combining module 381 performs the combination:

$$I_n = z_n - z_{n-1} - z_{n-2} + z_{n-3} \tag{20-1}$$

and a second combining module 382 performs the combination:

$$Q_n = -z_n - z_{n-1} + z_{n-2} + z_{n-3} \tag{20-2}$$

The outputs from the first and second combining modules are decimated by a factor 4 in the decimators 391 and 392 respectively to give:

$$I(kT) = I_{4n} \quad (21\text{-}1)$$

$$Q(kT) = Q_{4n} \quad (21\text{-}2)$$

It is understood that this second embodiment, as the first one, enables a quadrature demodulation to be performed without resorting to analogue mixers.

In the first as in the second embodiment, it is important to know the re-sampling point in time (or decimation point in time) in the decimators 291, 292 and 391, 392. It is understood indeed that there are four decimation possibilities for the samples $I_n$, $Q_n$. The receiver does not know the way he has to time the decimation in the series of samples. Stated in an equivalent manner, the receiver does not know the sampling phase (phase of the carrier at the re-sampling point in time), called hereinafter sampling phase IQ.

To properly time the sampling phase IQ, the particular format of the VHBR transmission is advantageously taken to advantage, that is the fact that each frame is preceded by an interval during which the carrier is not modulated. This time interval is provided to enable the receiver to recover energy before beginning the demodulation.

If the receiver is equipped with a PLL, it is assumed that during this time interval, the phase locked loop (PLL) of the receiver has time enough to be locked in frequency on the received carrier. Alternatively, the receiver can be equipped with a reference tuned (quartz) to the carrier frequency.

Figure 4:
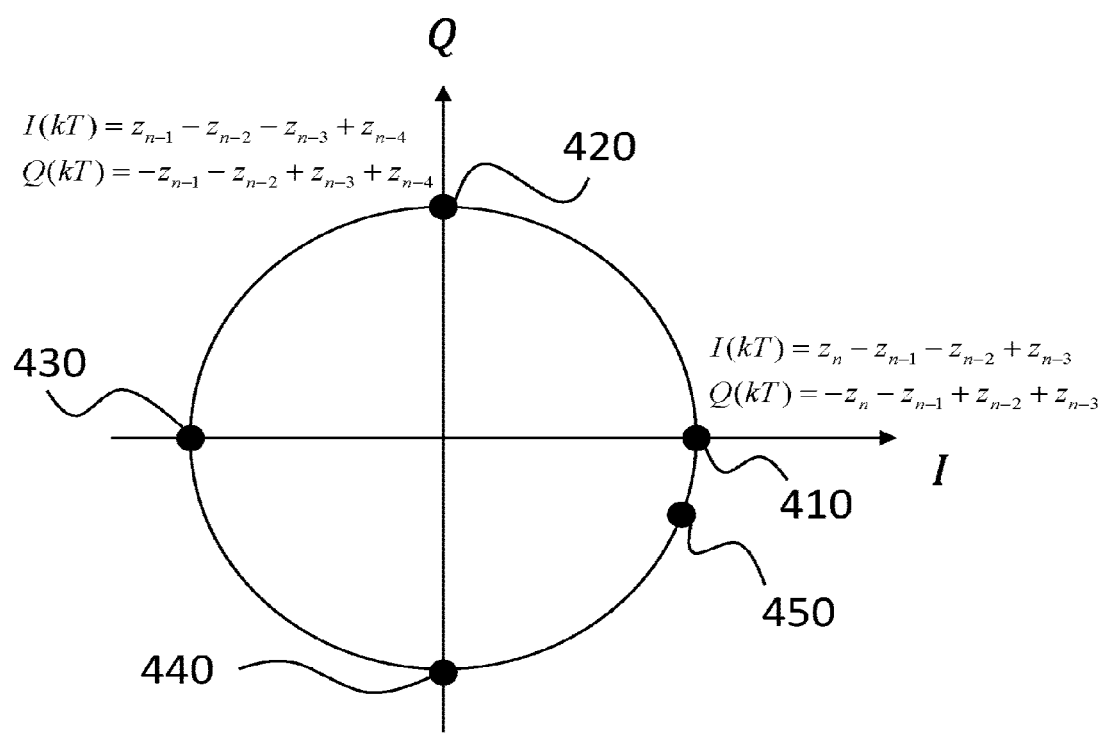
FIG. 4 schematically represents different possible sampling phases of the decimators in the demodulator of FIG. 2 or FIG. 3.

In FIG. 4, on the unit circle, the four possible sampling phases IQ are represented.

In position 410, the sampling phase IQ is zero, in other words the sampling is properly timed with respect to the carrier. All the power from the demodulated signal is thus on the channel I with $I(kT) > 0$ and the power on the channel Q is almost zero, in other words $Q(kT) = 0$.

In position 420, the sampling phase IQ is $$\frac{\pi}{2},$$

that is the re-sampling point in time is $$\frac{T}{4}$$

ahead of time with respect to what it would be (offset by one sample in the buffer). All the power from the demodulated signal is on the channel Q with $Q(kT) > 0$ and the power on the channel I is almost zero, in other words $I(kT) = 0$.

In position 430, the sampling phase IQ is $\pi$, that is the re-sampling point in time is offset by $$\frac{T}{2}$$

with respect to what it would be (offset by 2 samples in the buffer). All the power from the demodulated signal is on the channel I with $I(kT) < 0$ and the power on the channel Q is almost zero, in other words $Q(kT) = 0$.

Finally, in position 440, the sampling phase IQ is $$-\frac{\pi}{2},$$

that is the re-sampling point in time is $$\frac{T}{4}$$

delayed with respect to what it would be (offset by 3 samples in the buffer).

If the sampling phase IQ is not in one of these four positions, for example if it is located in position 450, this means that the clock (provided by the PLL loop or by the frequency reference) is poorly tuned in phase and/or in frequency. The lock phase $g^+(t)$ (and $\bar{g}^+(t)$) can then be corrected such that the sampling phase is in one of the four previous positions.

The timing of sampling IQ is performed by calculating the powers received on the channels I and Q for one or more sampling phases.

If the calculation is performed for a single phase at the same time, the sampling phases IQ are successively scanned until the sampling phase IQ which gives $I(kT) > 0$ and $Q(kT) = 0$ is found. In practice, it is sufficient to test in parallel two neighbouring phases and to identify the one for which $Q(kT) = 0$. If $I(kT) > 0$, the sampling phase IQ is zero and thus the timing of the decimators is proper. On the other hand, if $I(kT) < 0$, the sampling phase IQ is $\pi$ and it is sufficient to offset the sampling of the decimators by two samples.

To obtain a quicker sampling timing, the powers on the channels I and Q could be calculated for at least two sampling phases. Advantageously, two neighbouring sampling phases in parallel will be tested. Thus, which is the one for which $Q(kT) = 0$ will be determined and from the sign of the samples $I(kT)$ obtained for this phase, it is decided whether the decimator is well synchronized ($I(kT) > 0$) or if the decimation should be offset by two samples ($I(kT) < 0$).

In practice, the decision is not taken on a single sample by sampling phase IQ thus tested but on an average of such samples by sampling phase IQ, so as to remove noise. This average can be calculated by accumulation on a predetermined number of samples or by a low-pass filtering (for example a recursive low-pass filter) in a known manner per se.

Optionally, the value of the calculated average can also be used to facilitate synchronization of the clock of the PLL, when this is present, with respect to the carrier (for example, the sampling phase IQ in 450 gives an indication of the clock offset with respect to the carrier).

Figure 5:
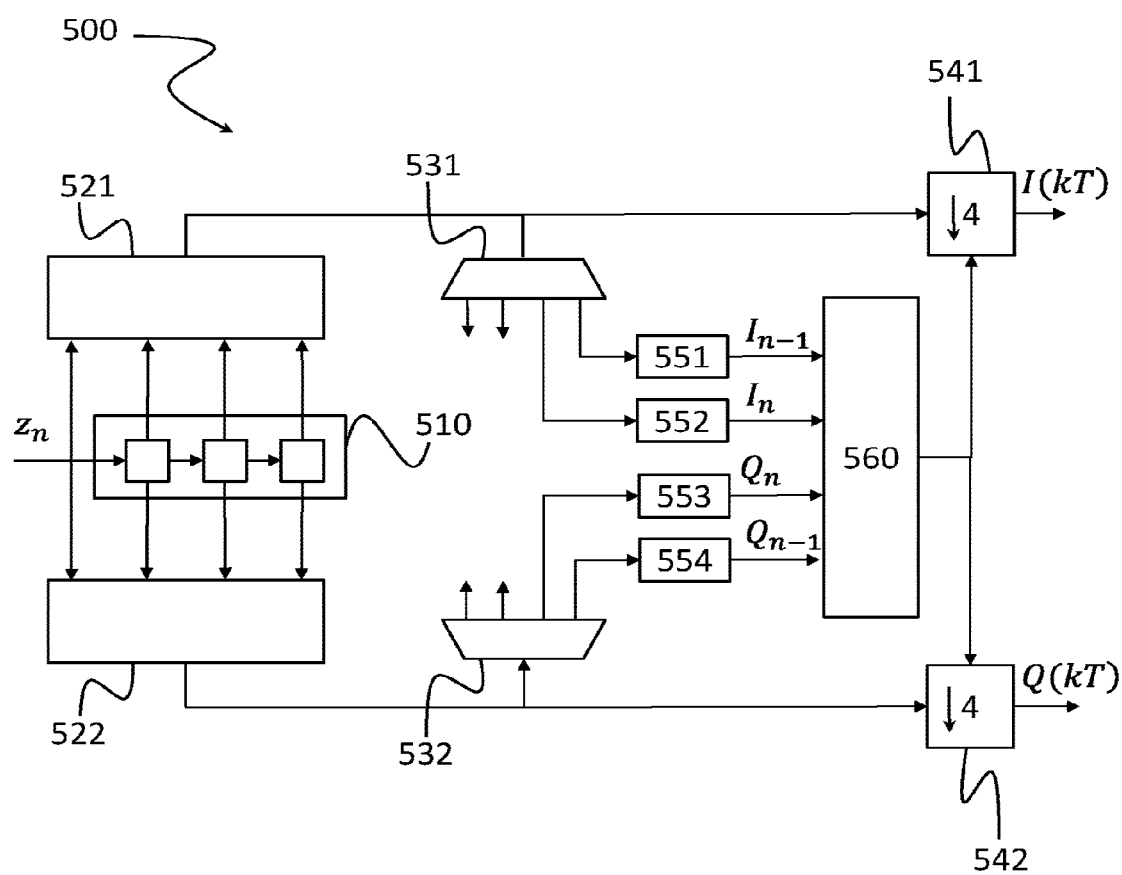
FIG. 5 schematically represents a quadrature demodulator according to FIG. 3 or 4 with a synchronization of the I/Q sampling.

FIG. 5 schematically represents a quadrature demodulator with synchronization of the sampling of the channels I and Q (also called synchronization 10). More precisely, in 500 is represented a demodulator module loaded with the synchronization of the sampling on the channels I and Q.

510 designates the buffer memory containing the samples $z_n$ as well as 521 and 522 designate the combining modules related to the channels I and Q. It will be understood that the FIFO register 510 corresponds to the buffer memory 270 of FIG. 2 or to the buffer memory 370 of FIG. 3. The combining modules 521 and 522 correspond to the combining modules 281 and 282 of FIG. 2 or to the combining modules 384 and 385 of FIG. 3. Finally, the decimators 541 and 542 represent the decimators 291 and 292 of FIG. 2 or the decimators 391 and 392 of FIG. 3.

The samples $I_n$ output from the combining module 521 are transmitted on the one hand to a multiplexer (1 to 4) with four outputs, 531, and on the other hand to a decimator, 541, with a decimation factor 4. The demultiplexer 531 can for example be made by means of a series/parallel converter forming words with four successive samples.

In the example illustrated, two outputs of the demultiplexer 531 are respectively connected to accumulators 551 and 552 making a moving average on a predetermined number of samples. This number is chosen such that the accumulation duration is lower than the duration of the interval preceding the transmission frame. Thus, the received signal is actually a carrier which is not modulated during the accumulation time. The two outputs are here chosen contiguous, in other words the tested sampling phases IQ are neighbours (in quadrature). The averages from the accumulators for these two sampling phases IQ are provided to a decision module 560.

In a similar way, the samples $Q_n$ output from the combining module 522 are transmitted on the one hand to a four output demultiplexer, 532, and on the other hand to a decimator, 542, with a decimation factor 4. The demultiplexer 532 can be for example made by means of a series/parallel converter forming words with four successive samples. As for the channel I, two output terminals of the demultiplexer 532 are respectively connected to accumulators 553 and 554, these accumulators making a moving average on said predetermined number of samples. Both outputs of the demultiplexer 532 are the same as those of the demultiplexer converter 531. The averages from both these accumulators are also provided to the decision module 560.

Thus, the decision module has the samples $I_n$, $Q_n$ and $I_{n-1}$, $Q_{n-1}$. The decision module determines which of $Q_n$ and $Q_{n-1}$ is lower in absolute value than a threshold, and then for this one, determines the sign of the corresponding quadrature sample $\text{sgn}(I_n)$ or $\text{sgn}(I_{n-1})$. From this information, the decision module 560 determines the decimation point in time corresponding to the zero sampling phase.

The decision module 560 controls the point in time of the sampling IQ (decimation point in time) in the decimators 541 and 542. The samples obtained by decimation are thus those corresponding to the zero sampling phase IQ.

After synchronization of the sampling 10, the samples Q(kT) of the quadrature channel are of an almost zero power during the interval preceding the transmission frame. On the other hand, during the transmission frame, the carrier is modulated, and the samples of the quadrature channel of course bear a phase information about the transmitted symbols.

Those skilled in the art will understand that the first and second demultiplexers 531-532, the accumulators 521-522 as well as the decision module 560 could be implemented according to different alternatives without departing from the scope of the present invention. In particular, some calculations made in parallel by the accumulators could be made in series within a single accumulator operating at a higher frequency.

Once the quadrature demodulator is synchronized, (that is, for example, after locking the PLL when this is present) and synchronization of the sampling of the channels I, Q as previously described, a last synchronization should be performed to recover the symbols transmitted. Indeed, in a RFID VHBR system, the symbols are transmitted by a PSK modulation on a symbol duration $T_s$ that can be 2T or 4T, also called ETU (Elementary Time Unit). In other words, the baud rate is $R_s=f/4(f/2)$ and the ETU is of the duration 4T (2T). It is reminded that the baud rate is the rate at which the modulation symbols are transmitted.

If the RFID receiver knows the baud rate of the transmitter, on the other hand he does not know when a symbol begins in the sequence of samples I(kT), Q(kT).

To perform this synchronization, it is suggested here to exploit the particular structure of the transmission frame. Indeed, each frame is preceded by a preamble of 140 symbols. Among these 140 symbols, the first 44 ones have alternate Q components at the frequency $R_s/2$. More preciously, these first 44 symbols form a series: a, a, a*, a*, a, a, a*, a*, . . . where a and a* are conjugate symbols belonging to the modulation constellation.

A detailed description of the structure of the preamble of the transmission frame will be found in the ISO/IEC 14443-2:2010 standard project entitled "Identification cards contactless integrated circuit cards—proximity cards, Part 2: Radio frequency power and signal interface" available on the site www.iso.org.

Figure 6:
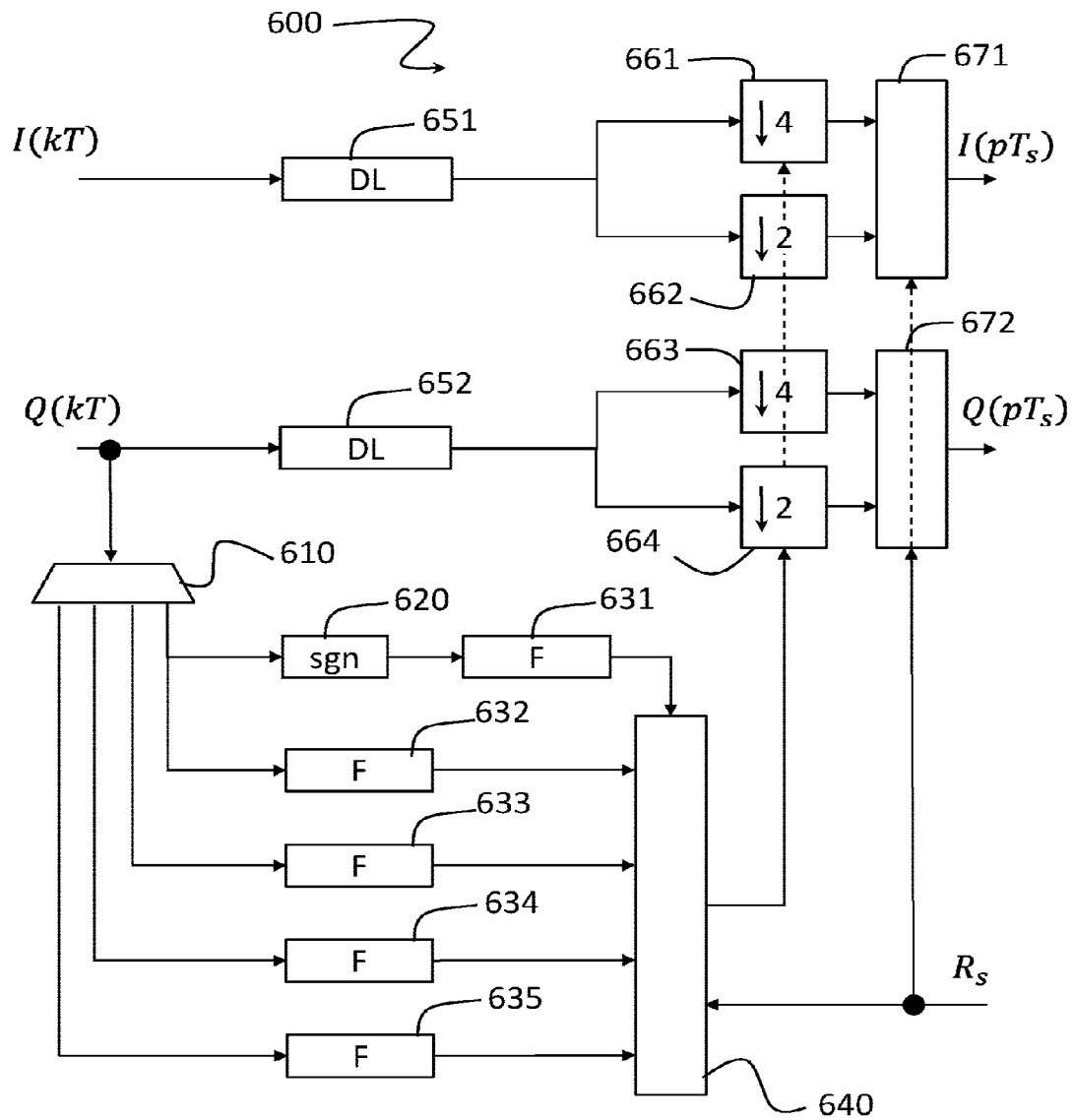
FIG. 6 schematically represents a quadrature demodulator according to FIG. 5 with synchronization at the baud rate.

FIG. 6 schematically shows a quadrature demodulator with a synchronization at the baud rate.

More precisely, in this Figure, a module 600 loaded with the synchronization at the baud rate is represented.

This module receives as an input, at the rate f, the samples I(kT) and Q(kT), from the quadrature demodulator with a synchronization IQ of FIG. 5.

As previously indicated, the baud synchronization takes advantage of the alternate sign of the component Q for the first symbols of the preamble, that is +1, +1, −1, −1, +1, +1, . . . .

The sequence of the successive samples Q(kT) is divided by a third demultiplexer (1 to 4), 610, into four subsequences respectively formed by the samples having indices such that k=0[4], k=1 [4], k=2[4], k=3[4] where [ ] designates the modulo, each of these subsequences being correlated by correlation means 632-635 with semi-alternate series +1, +1, −1, −1, +1, +1, . . . . The subsequence corresponding to the correlation maximum enables the decimation of the samples I(kT) and Q(kT) to be timed to obtain the real and imaginary parts of the successive symbols.

The demultiplexer 610 can be made for example in the form of a series/parallel converter. When $R_s=f/4$, the words output from the demultiplexer 610 represent the duration of a symbol and when $R_s=f/2$, the words output from the demultiplexer 610 represent the duration of two consecutive symbols.

Any of the outputs from the demultiplexer (here the first output) is connected to a sign detector 620. The sign signal is correlated in a correlation filter 631 with the semi-alternate sequence +1, +1, −1, −1, +1, +1, . . . with a predetermined length L (in practice, this length could be chosen equal to 32), at the frequency f/4 or f/2 as the case may be. When the correlation result exceeds a predetermined threshold (for example $$\frac{L-1}{2}),$$

the beginning of the preamble is detected and the second decision module 640 is activated.

This decision module receives the correlation results from the subsequences with the correlation means, more precisely the correlation results from the different outputs of the demultiplexer with correlation filters 632, 633, 634, 635.

These filters have a structure identical to that of the filter 631. The decision module compares the correlation results and deduces therefrom the alignment of the samples I(kT) and Q(kT) with respect to the symbols (or to the ETUs).

The samples I(kT) and Q(kT) are on the other hand respectively delayed in the delay lines 651 and 652 to compensate for the processing time in the demultiplexer 610, the correlation filters and the decision module. The second decision module 640 enables the sampling to be timed (at the baud rate) of the decimators 661 (or 662) on the channel I and 663 (or 664) on the channel Q. The multiplexers 671 and 672 enable the output of the decimator to be chosen depending on the baud rate.

The output samples are the components $I(pT_s)$ and $Q(pT_s)$ of the successive symbols, p representing the index of the symbols in question. The symbols are then transmitted to the PSK demodulator.

Those skilled in the art will understand that the demultiplexer 610, the correlation means 632-635 and the second decision module 640 could be implemented according to different alternatives without departing from the scope of the present invention. In particular, some calculations performed by the different correlation filters in parallel could be made by a single correlation filter operating at a higher frequency, the choice of the implementation depending on a compromise between the circuit silicon area and its operation speed. Further, it could dispense with the multiplexers 671 and 672 and make the decimation choice as a function of the baud rate by simply cutting off the decimator clock which is not selected.

The invention claimed is:

1. A quadrature demodulator for demodulating a received signal modulated at a carrier frequency f=1/T, wherein the quadrature demodulator generates a first square logic signal ($g^+(t)$) at a frequency 2f and a second square logic signal ($\overline{g}^+(t)$) being the inverse of the first square logic signal, the quadrature demodulator comprising:
a first integrator for integrating a first component of a received signal (y(t), $y^+(t)$) when the first square logic signal is in a high state and providing a first integration result when the first square logic signal is in a low state;
a second integrator for integrating said first component of the received signal (y(t), $y^+(t)$) when the second square logic signal is in a high state and providing a second integration result when the second square logic signal is in a low state;
a first subtractor for subtracting a second integration result from a first integration result for providing samples $z_n$ at frequency 4f;
a first combining module for combining successive samples $z_n$, $z_{n-1}$, $z_{n-2}$, $z_{n-3}$ and providing samples $I_n = z_n - z_{n-1} - z_{n-2} + z_{n-3}$ at the frequency 4f;
a second combining module for combining the successive samples $z_n$, $z_{n-1}$, $z_{n-2}$, $z_{n-3}$ and providing samples $Q_n = z_n - z_{n-1} + z_{n-2} + z_{n-3}$ at the frequency 4f;
a first decimator for decimating the samples $I_n$ with a decimation factor 4 for providing in-phase component samples I(kT); and
a second decimator for decimating the samples $Q_n$ with the decimation factor 4 for providing quadrature component samples Q(kT).

2. The quadrature demodulator according to claim 1, wherein the first component of the received signal is the received signal itself.

3. The quadrature demodulator according to claim 1, wherein the first component ($y^+(t)$) of the received signal corresponds to a positive part of the received signal, and a second component ($y^-(t)$) of the received signal corresponds to a negative part of the received signal, the received signal being a combination of the first component and the second component, and
wherein the demodulator further comprises:
a third integrator for integrating the second component of the received signal when the first square logic signal is in the high state and providing a third integration result when the first square logic signal is in the low state;
a fourth integrator for integrating the second component of the received signal when the second square logic signal is in the high state and providing a fourth integration result when the second square logic signal is in the low state; and
a second subtractor for subtracting the fourth integration result from the third integration result, the samples $z_n$ being obtained as a combination of results from the first and second subtractors.

4. The quadrature demodulator according to claim 1, further comprising a first analogue-digital converter for converting the first and second integration results before the subtraction by the first subtractor.

5. The quadrature demodulator according to claim 3, further comprising a first analogue-digital converter for converting the first and second integration results before the subtraction by the first subtractor as well as a second analogue-digital converter for converting the third and fourth integration results before the subtraction by the second subtractor.

6. The quadrature demodulator according to claim 1, further comprising:
a first demultiplexer receiving the samples $I_n$ and demultiplexing the samples $I_n$ to four outputs;
a second demultiplexer receiving the samples $Q_n$ and providing the samples $Q_n$ to four outputs; and
a first decision module receiving at least one sample on an output of the first demultiplexer and at least one sample on a corresponding output of the second demultiplexer, said first decision module deciding, for a time interval when said carrier frequency is not modulated, a decimation point in time in the first and second decimators.

7. The quadrature demodulator according to claim 6, wherein the first decision module receives two consecutive samples $I_n$, $I_{n-1}$ on two neighbouring outputs of the first demultiplexer and two consecutive samples $Q_n$, $Q_{n-1}$ on two neighbouring outputs of the second demultiplexer, the first decision module deciding the decimation point in time by comparing in absolute value $I_n$, $I_{n-1}$ with a predetermined threshold and for the absolute value and for the sample $I_n$, respectively $I_{n-1}$, lower than the predetermined threshold by determining a sign of corresponding sample $Q_n$, respectively $Q_{n-1}$.

8. The quadrature demodulator according to claim 6, wherein the first decision module receives two consecutive samples $I_n$, $I_{n-1}$ on two neighbouring outputs of the first demultiplexer and two consecutive samples $Q_n$, $Q_{n-1}$ on two neighbouring outputs of the second demultiplexer, the first decision module deciding the decimation point in time by comparing in absolute value $Q_n$, $Q_{n-1}$ with a predetermined threshold and for the absolute value and for the sample $Q_n$, respectively $Q_{n-1}$, lower than the predetermined threshold by determining a sign of corresponding sample $I_n$, respectively $I_{n-1}$.

9. The quadrature demodulator according to claim 7, wherein the samples on each of the two neighbouring outputs of the first and second demultiplexers are filtered by low-pass filters before being provided to the first decision module.

10. The quadrature demodulator according to claim 6, wherein, for each transmission frame beginning with a sequence of a, a, a*, a*, a, a, ... type pilot symbols, the samples output from the second decimator are converted by a third demultiplexer having outputs, samples of one of the outputs of the third demultiplexer being sign-detected before being correlated by a signed sequence having a predetermined length in a correlator, and wherein a second decision module is activated as soon as a result of the correlation exceeds a predetermined threshold.

11. The quadrature demodulator according to claim 10, wherein the samples of different outputs of the third demultiplexer are respectively correlated with said signed sequence in a plurality of correlators for providing a plurality of correlation results, and the decision module determining, when activated, a highest correlation result and deducing therefrom a sampling point in time of at least one third and one fourth decimator respectively receiving the samples output from the first and second decimators for providing in-phase and quadrature components of modulation symbols at a baud frequency.

12. A quadrature demodulation method for demodulating a received signal modulated at a carrier frequency $f=1/T$, wherein, from a signal locked at the carrier frequency, a first square logic signal ($g^+(t)$) at a frequency $2f$ and a second square logic signal ($\overline{g^+}(t)$) being the inverse of the first square logic signal are generated, the method comprising performing:

a first integration of a first component of a received signal ($y(t)$, $y^+(t)$) when the first square logic signal is in a high state, a first integration result being obtained when the first square logic signal is in a low state;

a second integration of said first component of the received signal ($y(t)$, $y^+(t)$) when the second square logic signal is in a high state, a second integration result being obtained when the second square logic signal is in a low state;

a subtraction for subtracting a second integration result from a first integration result and providing samples $z_n$ at frequency $4f$;

a first combination for combining successive samples $z_n$, $z_{n-1}$, $z_{n-2}$, $z_{n-3}$ and providing samples $I_n = z_n - z_{n-1} - z_{n-2} + z_{n-3}$ at the frequency $4f$;

a second combining module for combining successive samples $z_n$, $z_{n-1}$, $z_{n-2}$, $z_{n-3}$ and providing samples $Q_n = z_n - z_{n-1} + z_{n-2} + z_{n-3}$ at the frequency $4f$;

a first decimation for decimating the samples $Q_n$ with a decimation factor 4 for providing in-phase component samples $I(kT)$; and a second decimation for decimating the samples $Q_n$ with the decimation factor 4 for providing quadrature component samples $Q(kT)$.

* * * * *

UNITED STATES PATENT AND TRADEMARK OFFICE
CERTIFICATE OF CORRECTION

PATENT NO. : 9,712,211 B2
APPLICATION NO. : 15/204310
DATED : July 18, 2017
INVENTOR(S) : Pierre Courouve et al.

It is certified that error appears in the above-identified patent and that said Letters Patent is hereby corrected as shown below:

On the Title Page

Item (73), the Assignee's Name is incorrect. Item (73) should read:

--(73) Assignee: COMMISSARIAT A L'ENERGIE ATOMIQUE ET AUX ENERGIES ALTERNATIVES, Paris (FR)--

Signed and Sealed this
Tenth Day of April, 2018

Andrei Iancu
*Director of the United States Patent and Trademark Office*